United States Patent
Jung et al.

(10) Patent No.: US 11,032,459 B2
(45) Date of Patent: Jun. 8, 2021

(54) CAMERA MODULE INCLUDING REINFORCEMENT MEMBERS FOR SUPPORTING PRINTED CIRCUIT BOARD ON WHICH PLURALITY OF IMAGE SENSORS ARE DISPOSED AND ELECTRONIC DEVICE INCLUDING THE SAME

(71) Applicant: Samsung Electronics Co., Ltd., Suwon-si (KR)

(72) Inventors: Hwajoong Jung, Osan-si (KR); Manho Kim, Suwon-si (KR); Taehyuk Kim, Osan-si (KR); Taeyun Kim, Suwon-si (KR); Yonghwan Choi, Suwon-si (KR); Kihuk Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/053,128

(22) Filed: Aug. 2, 2018

(65) Prior Publication Data

US 2019/0068846 A1    Feb. 28, 2019

(30) Foreign Application Priority Data

Aug. 22, 2017    (KR) .......................... 10-2017-0106293

(51) Int. Cl.
*H04N 5/225* (2006.01)
*H05K 1/02* (2006.01)

(52) U.S. Cl.
CPC ......... *H04N 5/2258* (2013.01); *H04N 5/2253* (2013.01); *H04N 5/2254* (2013.01); *H04N 5/2257* (2013.01); *H05K 1/0271* (2013.01)

(58) Field of Classification Search
CPC .. H04N 5/2257; H04N 5/2258; H04N 5/2253; H05K 1/0271; H05K 1/0281; H05K 3/0058; H05K 3/0067; H05K 7/1452; H05K 2201/2009
See application file for complete search history.

(56) References Cited

U.S. PATENT DOCUMENTS

2005/0046740 A1*  3/2005  Davis ................... H04N 5/2254
                                                        348/373
2012/0086784 A1   4/2012  Oh et al.
(Continued)

FOREIGN PATENT DOCUMENTS

CN    104349030 A    2/2015
CN    104580855 A    4/2015
(Continued)

OTHER PUBLICATIONS

International Search Report dated Nov. 2, 2018; International Appln. No. PCT/KR2018/008799.
(Continued)

*Primary Examiner* — Paul M Berardesca
(74) *Attorney, Agent, or Firm* — Jefferson IP Law, LLP

(57) ABSTRACT

An apparatus and method for a camera module is provided. The camera module includes a substrate, a first image sensor disposed in a first area on one side of the substrate, a second image sensor disposed in a second area on the one side, a reinforcement member disposed in an area around the first area and the second area so as to support at least a portion of the substrate, a first housing disposed in an area including at least a portion of the first area so as to be stacked on the first image sensor and one part of the reinforcement member while accommodating a first lens part corresponding to the first image sensor, and a second housing disposed in an area including at least a portion of the second area so as to be stacked on the second image sensor and the other part of the reinforcement member.

9 Claims, 5 Drawing Sheets

(56) References Cited

U.S. PATENT DOCUMENTS

| | | | |
|---|---|---|---|
| 2013/0033581 A1 | 2/2013 | Woo et al. | |
| 2015/0109422 A1 | 4/2015 | Weiss | |
| 2016/0037031 A1 | 2/2016 | Bull et al. | |
| 2016/0241763 A1 | 8/2016 | Jung et al. | |
| 2017/0085764 A1 | 3/2017 | Kim et al. | |
| 2017/0244877 A1* | 8/2017 | Wang | H04N 5/2258 |
| 2017/0272634 A1* | 9/2017 | Wang | H04N 5/2258 |
| 2017/0310861 A1* | 10/2017 | Wang | H04N 5/2254 |
| 2018/0196219 A1 | 7/2018 | O et al. | |
| 2018/0275368 A1* | 9/2018 | Lee | G03B 19/22 |
| 2018/0376123 A1* | 12/2018 | Rendlen | H04N 13/239 |
| 2019/0041904 A1* | 2/2019 | Fletcher | H04M 1/026 |

FOREIGN PATENT DOCUMENTS

| | | |
|---|---|---|
| CN | 104811589 A | 7/2015 |
| CN | 105187697 A | 12/2015 |
| CN | 105744131 A | 7/2016 |
| CN | 205545565 U | 8/2016 |
| CN | 205647691 U | 10/2016 |
| CN | 205992947 U | 3/2017 |
| CN | 206136071 U | 4/2017 |
| JP | 2016-036137 A | 3/2016 |
| JP | 2016-540196 A | 12/2016 |
| KR | 10-2009-0022672 A | 3/2009 |
| KR | 10-2012-0036584 A | 4/2012 |
| KR | 10-2013-0015293 A | 2/2013 |
| KR | 10-2017-0002188 A | 1/2017 |

OTHER PUBLICATIONS

European Search Report dated Nov. Nov. 8, 2018; European Appln. No. 181900523-1208.

Chinese Office Action dated Mar. 4, 2021, issued in Chinese Application No. 201810889367.1.

* cited by examiner

CAMERA MODULE INCLUDING REINFORCEMENT MEMBERS FOR SUPPORTING PRINTED CIRCUIT BOARD ON WHICH PLURALITY OF IMAGE SENSORS ARE DISPOSED AND ELECTRONIC DEVICE INCLUDING THE SAME

CROSS-REFERENCE TO RELATED APPLICATION(S)

This application is based on and claims priority under 35 U.S.C. § 119(a) of a Korean patent application number 10-2017-0106293, filed on Aug. 22, 2017, in the Korean Intellectual Property Office, the disclosure of which is incorporated by reference herein in its entirety.

BACKGROUND

1 Field

The disclosure relates to a camera module including reinforcement members and an electronic device including the camera module.

2 Description of Related Art

Portable terminals, such as smart phones or the like, have one or more camera modules (e.g., a dual camera) for capturing images or taking videos.

Recently, the development of digital and semiconductor technologies has promoted the spread of digital cameras and camera modules equipped with an image sensor of a charge coupled device (CCD) type or a complementary metal oxide semiconductor (CMOS) type.

The digital camera and the camera module are embedded in various digital devices, such as portable terminals, because of portability and simplicity of operation thereof.

The above information is presented as background information only to assist with an understanding of the disclosure. No determination has been made, and no assertion is made, as to whether any of the above might be applicable as prior art with regard to the disclosure.

SUMMARY

Since the camera module must be embedded in a portable terminal or the like, it is required to be miniaturized and slimmed.

In addition, a camera module, such as a dual camera, captures images using two aligned cameras.

In order to align image sensors that are embedded in the two cameras (dual camera), respectively, and in order to prevent deformation thereof, a metal structure may be mounted in the upper or lower portion of the dual camera.

However, when the metal structure is mounted in the upper or lower portion of the dual camera, the thickness of the camera module may increase, which results in an increase in the thickness of the electronic device including the dual camera.

Aspects of the disclosure are to address at least the above-mentioned problems and/or disadvantages and to provide at least the advantages described below. Accordingly, an aspect of the disclosure is to provide an apparatus and method for a camera module including a reinforcement member (e.g., a metal frame) mounted in the same layer as a first and second image sensors and electronic components (e.g., IC chips or the like), thereby preventing a substrate (e.g., a printed circuit substrate (PCB)) from warping due to external force without an increase in the thickness of the camera module.

Another aspect of the disclosure is to provide an apparatus and method for a camera module including another reinforcement member (e.g., a metal plate) mounted in the lower portion of the PCB, in addition to the reinforcement member (e.g., the metal frame), thereby preventing a substrate from warping due to external force and a change in the external temperature.

Another aspect of the disclosure is to provide an apparatus and method for an electronic device including a camera module equipped with reinforcement members for supporting a substrate on which a plurality of image sensors are disposed.

Additional aspects will be set forth in part in the description which follows and, in part, will be apparent from the description, or may be learned by practice of the presented embodiments.

In accordance with an aspect of the disclosure, a camera module is provided. The camera module includes a substrate, a first image sensor disposed in a first area on one side of the substrate, a second image sensor disposed in a second area on the one side, a reinforcement member disposed in an area around the first area and the second area so as to support at least a portion of the substrate, a first housing disposed in an area including at least a portion of the first area so as to be stacked on the first image sensor and one part of the reinforcement member while accommodating a first lens part corresponding to the first image sensor, and a second housing disposed in an area including at least a portion of the second area so as to be stacked on the second image sensor and the other part of the reinforcement member while accommodating a second lens part corresponding to the second image sensor.

In accordance with another aspect of the disclosure, a reinforcement member is provided. The reinforcement member includes a first window and a second window through which the first image sensor and the second image sensor are exposed.

The one part of the reinforcement member may surround and reinforce the first image sensor disposed in the first area, and the other part of the reinforcement member may surround and reinforce the second image sensor disposed in the second area.

The reinforcement member may be disposed in the same layer as the first image sensor and the second image sensor or electronic components on the substrate.

The one part of the reinforcement member and the other part of the reinforcement member may be integrally formed.

The first image sensor and the second image sensor may be disposed to be spaced a predetermined distance apart from each other.

A first cavity may be formed between the first image sensor and the first lens part such that light passes therethrough, and a second cavity may be formed between the second image sensor and the second lens part such that light passes therethrough.

The first housing may further accommodate a first driving part for driving the first lens part, and the second housing may further accommodate a second driving part for driving the second lens part.

An additional reinforcement member (e.g., a reinforcement plate) may be further disposed on the opposite side of the substrate.

A third window may be formed between the first window and the second window.

A first hole may be formed at a position corresponding to the first area, and a second hole may be formed at a position corresponding to the second area.

The first image sensor may be disposed at a position corresponding to the first hole on the additional reinforcement member, and the second image sensor may be disposed at a position corresponding to the second hole on the other reinforcement member.

In accordance with another aspect of the disclosure, an electronic device is provided. The electronic device includes a camera module including a substrate, a first image sensor disposed in a first area on one side of the substrate, a second image sensor disposed in a second area on the one side, a reinforcement member disposed in an area around the first area and the second area so as to support at least a portion of the substrate, a first housing disposed in an area including at least a portion of the first area so as to be stacked on one part of the reinforcement member while accommodating a first lens part corresponding to the first image sensor, and a second housing disposed in an area including at least a portion of the second area so as to be stacked on the other part of the reinforcement member while accommodating a second lens part corresponding to the second image sensor and a processor electrically connected to the camera module.

According to various embodiments of the disclosure, it is possible to prevent a substrate (e.g., a PCB) from warping due to external force without an increase in the thickness of the camera module by mounting a reinforcement member (e.g., a metal frame) in the same layer as a first and second image sensors and electronic components (e.g., IC chips or the like), thereby maintaining the alignment of the first and second image sensors.

According to various embodiments of the disclosure, it is possible to prevent a substrate from warping due to external force and a change in the external temperature by mounting another reinforcement member (e.g., a metal plate) in the lower portion of the PCB, in addition to the reinforcement member (e.g., the metal frame), thereby maintaining the alignment of the first and second image sensors.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages, of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
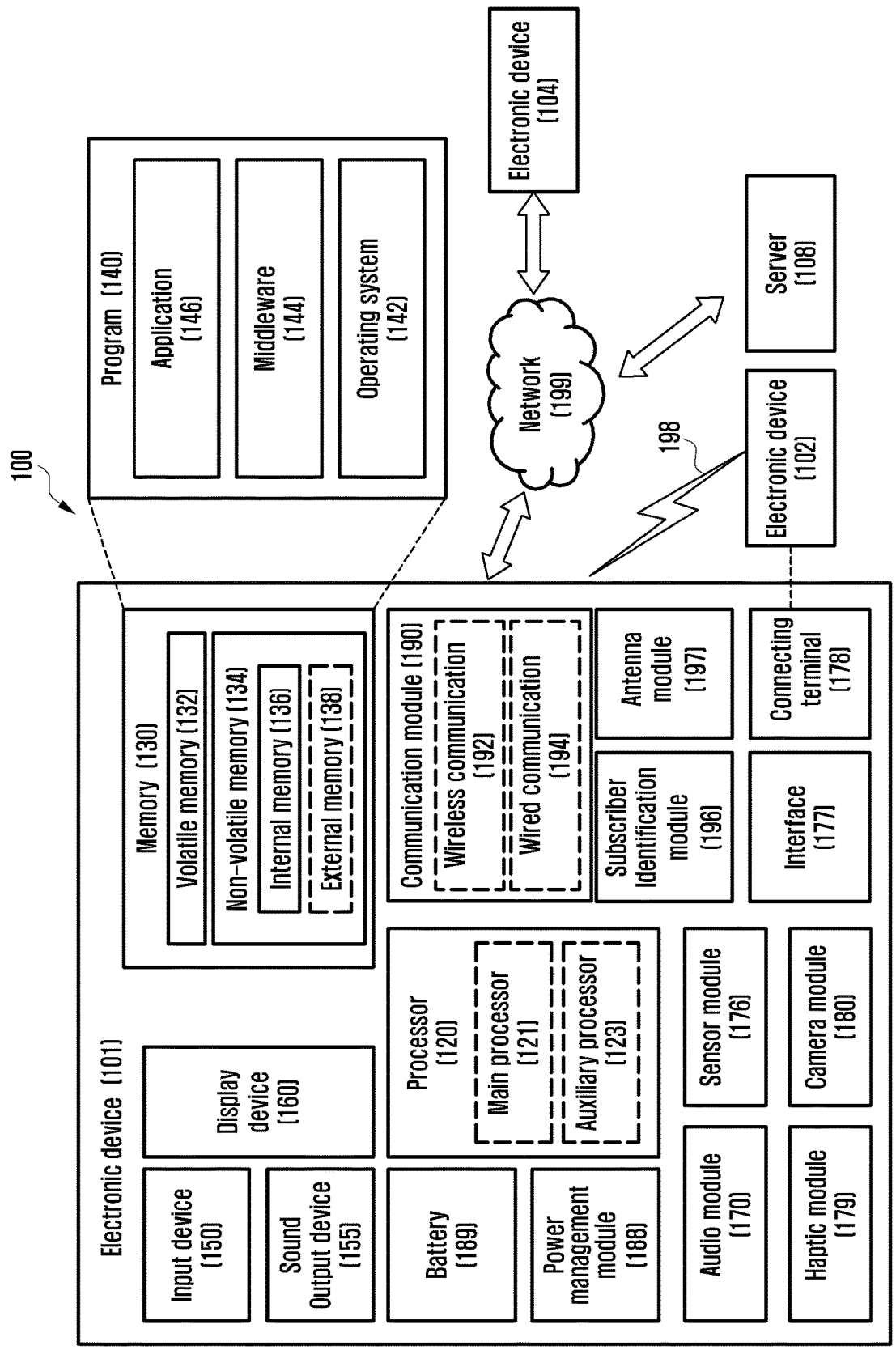
FIG. 1 is a block diagram of an electronic device in a network environment according to various embodiments of the disclosure.

FIG. 1 is a block diagram illustrating an electronic device 101 in a network environment 100 according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or IR data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
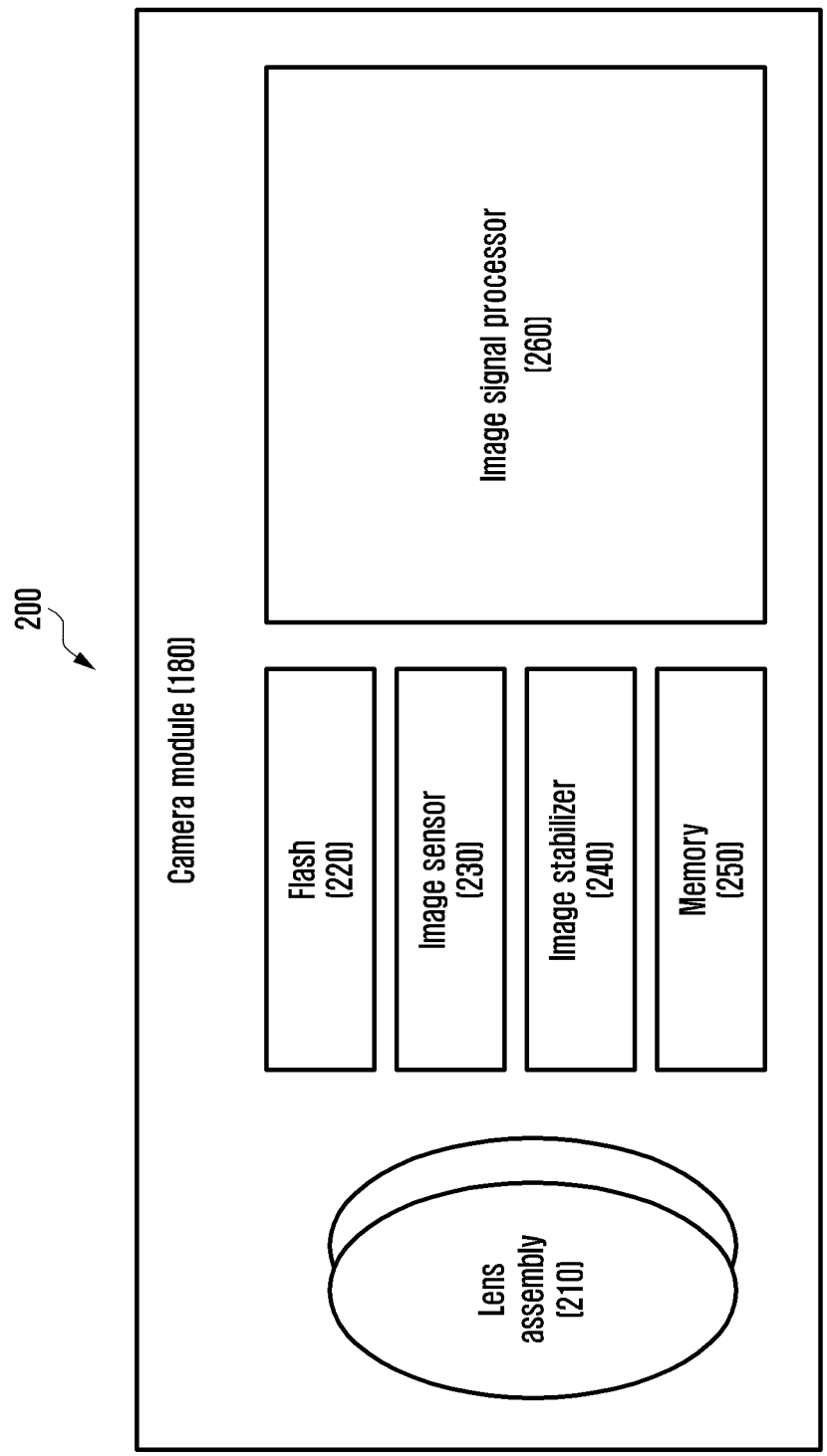
FIG. 2 is a block diagram of a camera module according to various embodiments of the disclosure.

FIG. 2 is a block diagram 200 illustrating the camera module 180 according to various embodiments of the disclosure.

Referring to FIG. 2, the camera module 180 may include a lens assembly 210, a flash 220, an image sensor 230, an image stabilizer 240, memory 250 (e.g., buffer memory), or an ISP 260. The lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light reflected from an object. According to an embodiment, the flash 220 may include one or more light emitting diodes (LEDs) (e.g., a red-green-blue (RGB) LED, a white LED, an IR LED, or an ultraviolet (UV) LED) or a xenon lamp.

The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer.

The memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display device 160. Thereafter, if a specified condition is met (e.g., by a user's input or system command), at least part of the raw image stored in the memory 250 may be obtained and processed, for example, by the ISP 260. According to an embodiment, the memory 250 may be configured as at least part of the memory 130 or as a separate memory that is operated independently from the memory 130.

The ISP 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the ISP 260 may perform control (e.g., exposure time control or read-out timing control) with respect to at least one (e.g., the image sensor 230) of the components included in the camera module 180. An image processed by the ISP 260 may be stored back in the memory 250 for further processing, or may be provided to an external component (e.g., the memory 130, the display device 160, the electronic device 102, the electronic device 104, or the server 108) outside the camera module 180. According to an embodiment, the ISP 260 may be configured as at least part of the processor 120, or as a separate processor that is operated independently from the processor 120. If the ISP 260 is configured as a separate processor from the processor 120, at least one image processed by the ISP 260 may be displayed, by the processor 120, via the display device 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
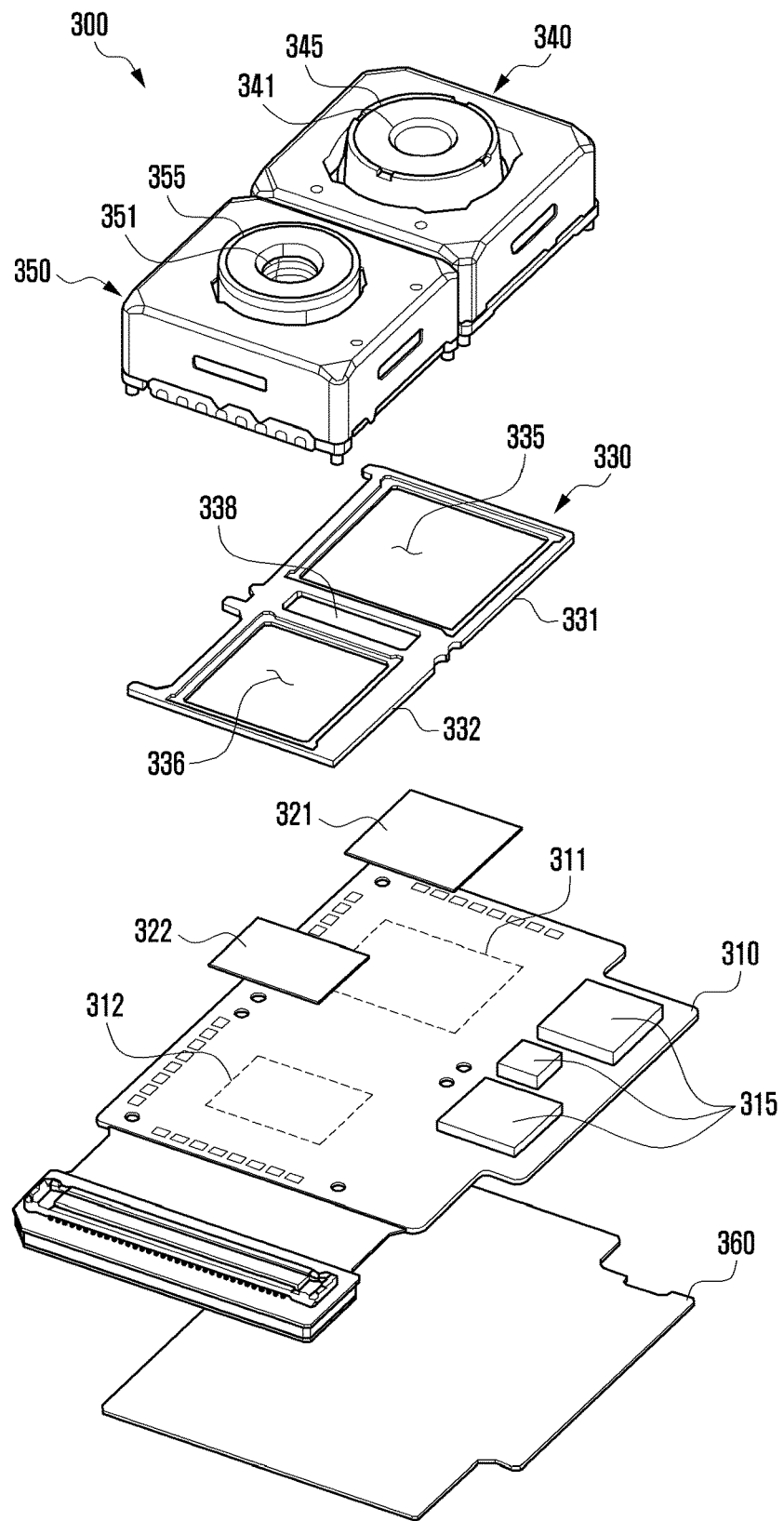
FIG. 3 is an exploded perspective view showing a configuration of a camera module according to various embodiments of the disclosure.

FIG. 3 is an exploded perspective view showing a configuration of a camera module according to various embodiments of the disclosure.

Figure 4:
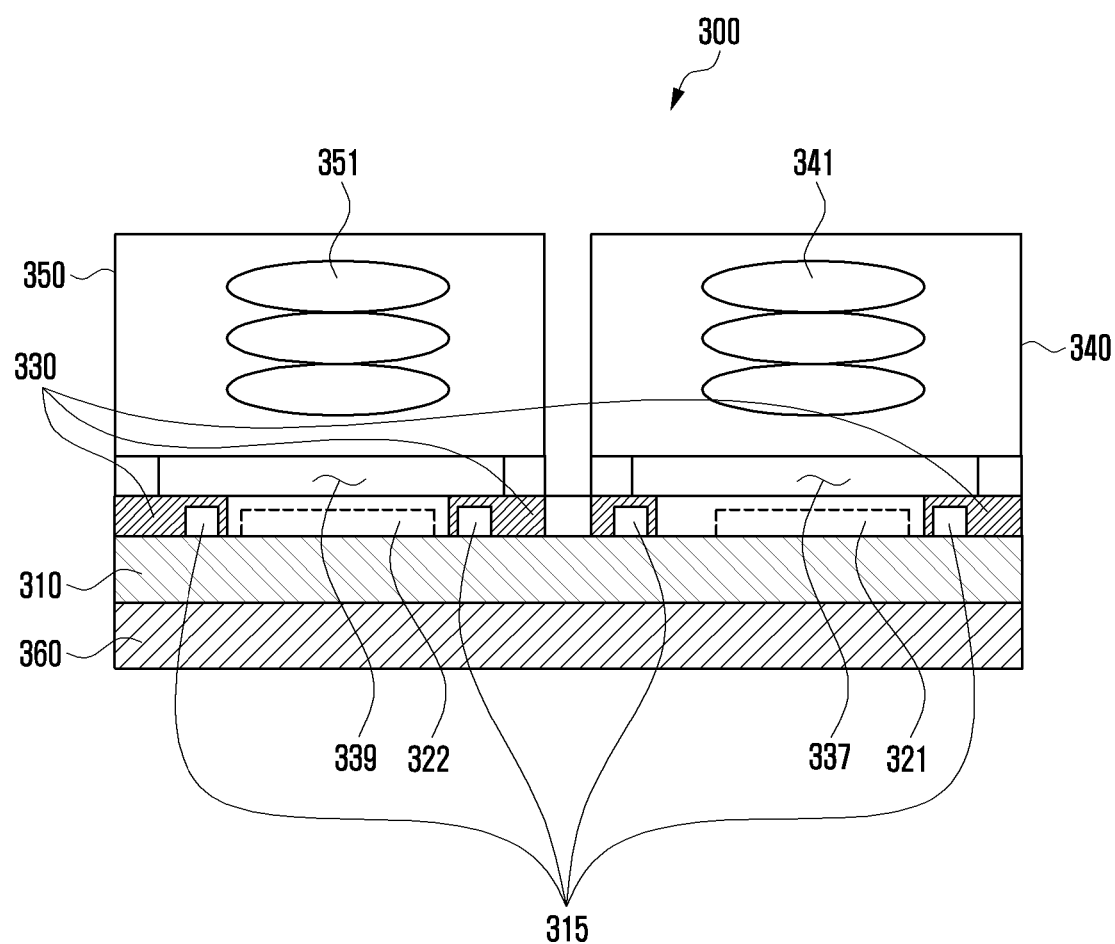
FIG. 4 is a cross-sectional view showing a configuration of a camera module according to various embodiments of the disclosure.

FIG. 4 is a cross-sectional view showing a configuration of a camera module according to various embodiments of the disclosure.

Referring to FIGS. 3 and 4, a camera module 300 (e.g., the camera module 180) according to various embodiments of the disclosure may include a substrate 310, a first image sensor 321 (e.g., the image sensor 230), a second image sensor 322 (e.g., the image sensor 230), a reinforcement member 330, a first housing 340, a second housing 350, and a reinforcement plate 360.

According to various embodiments, the camera module 300, for example, may be provided on the back side of the electronic device 101 in FIG. 1, thereby obtaining images of objects located to face the back side of the electronic device 101. The camera module 300, for example, may include the camera module 180 shown in FIGS. 1 and 2. The first image sensor 321 and the second image sensor 322 may include the image sensor 230 in FIG. 2, respectively.

The substrate 310 may include, on one side thereof, a first area 311 on which the first image sensor 321 is disposed and a second area 312 on which the second image sensor 322 is disposed. The first area 311 and the second area 312 may be spaced a predetermined distance apart from each other. The substrate 310 may include various electronic components 315 (e.g., the image stabilizer 240, the memory 250, and IC chips, such as the ISP 260 or the like, in FIG. 2), which are necessary for driving and operating the camera module 300, mounted on one side thereof. The substrate 310 may include a printed circuit substrate (PCB) or a flexible printed circuit substrate (FPCB). The substrate 310 may be electrically connected to the first image sensor 321 and the second image sensor 322. The substrate 310 may be configured to digitize image signals output from the first image sensor 321 and the second image sensor 322.

The first image sensor 321 may be disposed in a first area 311 on one side of the substrate 310. The second image sensor 322 may be disposed in a second area 312 on the one side of the substrate 310. The first image sensor 321 and the second image sensor 322 may be disposed so as to be spaced a predetermined distance apart from each other. The first image sensor 321 and the second image sensor 322 may be electrically connected to the substrate 310, respectively, by wire bonding, flip chip bonding, ultrasonic bonding, or the like. The first image sensor 321 and the second image sensor 322 may have CCDs or CMOSs for converting the light incident through a first lens part 341 and a second lens part 351 accommodated in the first housing 340 and the second housing 350 into an electrical signal, respectively. The first image sensor 321 and the second image sensor 322 may detect information on an object (subject) located to face the back side of the electronic device 101, and may convert the same into an electrical image signal. A first cavity 337 may be formed between the first image sensor 321 and the first lens part 341 such that light can pass therethrough. A second cavity 339 may be formed between the second image sensor 322 and the second lens part 351 such that light can pass therethrough.

According to various embodiments, the first image sensor 321 and the second image sensor 322 may be driven independently or simultaneously under the control of, for example, the ISP 260 in FIG. 2. The first image sensor 321 may obtain a first image of an external object located to face the back side of the electronic device 101. The second image sensor 322 may obtain a second image of an external object located to face the back side of the electronic device 101. For example, the first image sensor 321 may be initialized so as to detect a high illuminance-based exposure, thereby obtaining the first image, and the second image sensor 322 may be initialized so as to detect a low illuminance-based exposure, thereby obtaining the second image. Alternatively, the first image sensor 321 may be initialized so as to detect a low illuminance-based exposure, thereby obtaining the first image, and the second image sensor 322 may be initialized so as to detect a high illuminance-based exposure, thereby obtaining the second image. The first image sensor 321 and the second image sensor 322 may have different sensors or different aperture values.

The reinforcement member 330 may be disposed in an area formed around the first area 311 and the second area 312 on the substrate 310. The reinforcement member 330 may include a first part 331 surrounding and reinforcing the first image sensor 321 disposed in the first area 311 and a second part 332 surrounding and reinforcing the second image sensor 322 disposed in the second area 312. The reinforcement member 330 may be disposed in the same layer as the first image sensor 321, the second image sensor 322, or the electronic components 315 on the substrate 310. That is, the first part 331 of the reinforcement member 330 may be disposed in the same layer as the first image sensor 321, and the second part 332 may be disposed in the same layer as the second image sensor 322. The reinforcement member 330 may be mounted on the substrate 310 by means of a surface mount device (SMD), or may be bonded thereto by means of an adhesive (e.g., a thermosetting epoxy), thereby supporting at least a portion (e.g., the first area 311 and the second area 312) of the substrate 310. In the case where the reinforcement member 330 is mounted on the substrate 310, the structural rigidity of the substrate 310 may be reinforced, thereby preventing the same from warping. A first window 335, through which the first image sensor 321 is exposed, may be formed in the first part 331 of the reinforcement member 330. A second window 336, through which the second image sensor 322 is exposed, may be formed in the second part 332 of the reinforcement member 330.

According to various embodiments, a third window 338 may be formed between the first window 335 formed in the first part 331 of the reinforcement member 330 and the second window 336 formed in the second part 332 thereof. Electronic components (e.g., capacitors, resistors, diodes, and the like) for securing the performance of the first image sensor 321 and the second image sensor 322 may be mounted through the third window 338.

According to various embodiments, the reinforcement member 330 may be made of a material that is strong enough to resist against external force. For example, the reinforcement member 330 may include a metal frame made of a metal (e.g., stainless steel, aluminum, copper, or the like). The first part 331 and the second part 332 of the reinforcement member 330 may be integrally formed. The first part 331 and the second part 332 of the reinforcement member 330 may have constant rigidity so as to maintain the positions of the first image sensor 321 and the second image sensor 322.

The first housing 340 may be disposed in an area including at least a portion of the first area 311 formed on the substrate 310. A first lens part 341 corresponding to the first image sensor 321 may be accommodated in the first housing 340. The first housing 340 may accommodate a first image sensor 321 disposed in the first area 311 and a first part 331 of the reinforcement member 330 therein. The first housing 340 may accommodate a first driving part 345 driving the first lens part 341. The first driving part 345 may include a wide actuator.

The second housing 350 may be disposed in an area including at least a portion of the second area 312 formed on the substrate 310. A second lens part 351 corresponding to the second image sensor 322 may be accommodated in the second housing 350. The second housing 350 may accommodate a second image sensor 322 disposed in the second area 312 and a second part 332 of the reinforcement member 330. The second housing 350 may accommodate a second driving part 355 driving the second lens part 351. The second driving part 355 may include a tele-actuator.

According to various embodiments, the reinforcement member 330 having the first part 331 and the second part 332, which are integrally formed, may be accommodated in the first housing 340 and the second housing 350. The first lens part 341 in the first housing 340 and the second lens part 351 in the second housing 350 may capture still images or moving images for objects located to face the back side of the electronic device 101, respectively. The first housing 340 and the second housing 350 may further include an IR ray filter, an ISP, a digital signal processor (DSP), a peripheral flash (e.g., the flash 220), and the like, respectively. Each of the first lens part 341 and the second lens part 351 may include the lens assembly 210 shown in FIG. 2. The first part 331 and the second part 332 of the reinforcement member 330 may be integrally formed, thereby preventing warping from occurring between the first housing 340 and the second housing 350 by the external force. The first part 331 and the second part 332 of the reinforcement member 330 may be disposed inside the first housing 340 and the second housing 350, thereby preventing the substrate 310 from warping by the pressing pressure generated from the back side of the substrate 310.

The reinforcement plate 360 may be disposed in the lower portion of the substrate 310. The reinforcement plate 360 may be bonded to the substrate 310 by means of an adhesive (e.g., a thermosetting epoxy). The reinforcement plate 360 may prevent the substrate 310 from warping depending on the external force or a change in the external temperature. The reinforcement plate 360 may be different from the reinforcement member 330. The reinforcement plate 360 may be configured in the form of a plate.

According to various embodiments, the reinforcement plate 360 may be made of a material that is strong enough to resist against external force and temperature. For example, the reinforcement plate 360 may include a metal plate made of a metal (e.g., stainless steel, aluminum, copper, or the like). The reinforcement plate 360 may provide rigidity to the substrate 310 such that the positions of the first image sensor 321 and the second image sensor 322 mounted on the substrate 310 can be maintained.

Figure 5:
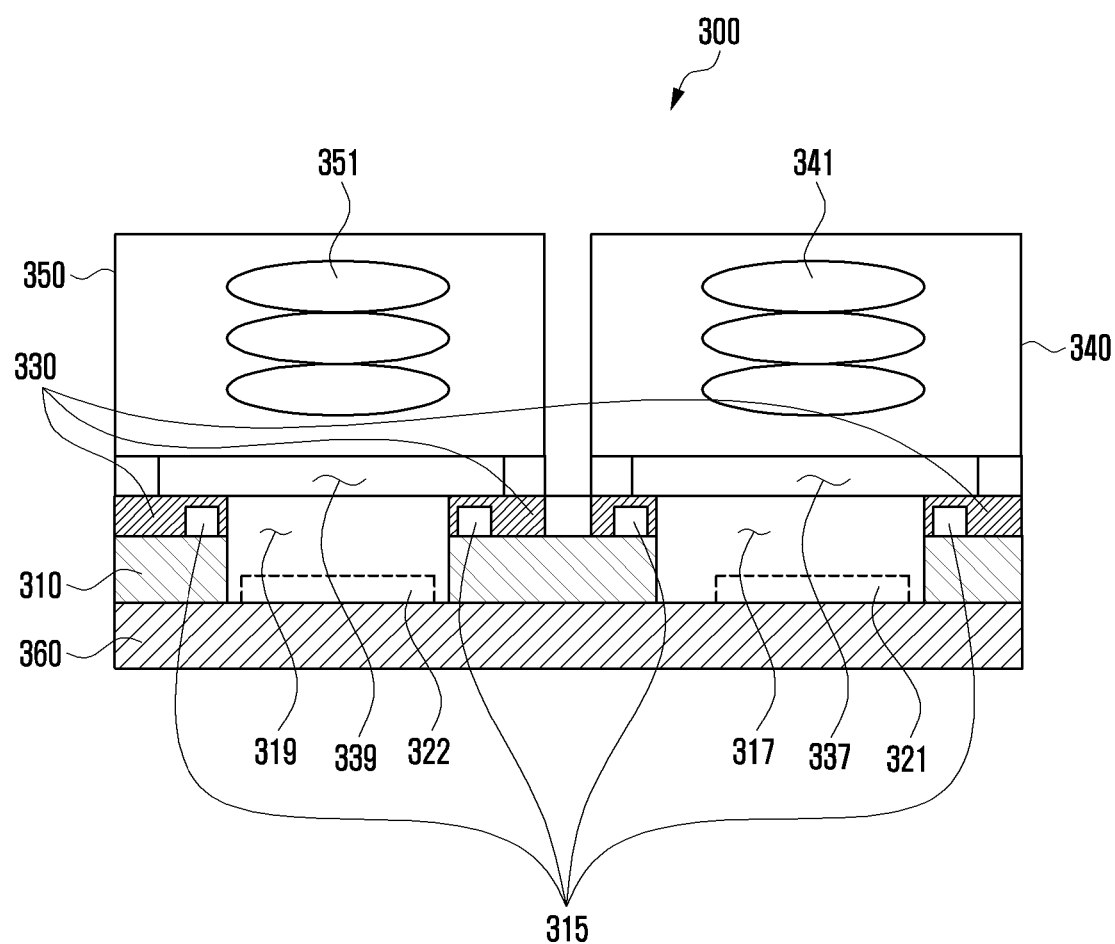
FIG. 5 is a cross-sectional view showing another configuration of a camera module according to various embodiments of the disclosure.

FIG. 5 is a cross-sectional view showing another configuration of a camera module according to various embodiments of the disclosure.

Referring to FIG. 5, a camera module 300 according to various embodiments of the disclosure may be configured such that the portions corresponding the first area 311 and the second area 312 of the substrate 310 shown in FIG. 3 are open. A first hole 317 may be formed at the position corresponding to the first area 311 of the substrate 310. A second hole 319 may be formed at the position corresponding to the second area 312 of the substrate 310. In this case, the first image sensor 321 may be disposed on the reinforcement plate 360 corresponding to the first hole 317. The second image sensor 322 may be disposed on the reinforcement plate 360 corresponding to the second hole 319.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A camera comprising:
a substrate;
a first image sensor;
a second image sensor;
a first reinforcement member disposed in an area around a first area over the first image sensor and a second area over the second image sensor so as to support at least a portion of the substrate;
a first housing disposed in an area including at least a portion of the first area so as to be stacked directly on one part of the first reinforcement member while accommodating a first lens part corresponding to the first image sensor; and
a second housing disposed in an area including at least a portion of the second area so as to be stacked directly on another part of the first reinforcement member while accommodating a second lens part corresponding to the second image sensor,
wherein a first hole is formed at a position corresponding to the first area of the substrate,
wherein a second hole is formed at a position corresponding to the second area of the substrate,
wherein the first image sensor is disposed, at a position corresponding to the first hole, directly on a second reinforcement member which is disposed on an opposite side of the substrate from the first reinforcement member,
wherein the second image sensor is disposed, at a position corresponding to the second hole, directly on the second reinforcement member,
wherein the first reinforcement member comprises a first window and a second window through which the first image sensor and the second image sensor are exposed,
wherein a third window is formed between the first window and the second window, and
wherein an electronic component, associated with performance of at least one of the first image sensor or the second image sensor, is mounted through the third window.

2. The camera of claim 1, wherein the one part of the first reinforcement member and the other part of the first reinforcement member are integrally formed.

3. The camera of claim 1, wherein the first image sensor and the second image sensor are disposed to be spaced a predetermined distance apart from each other.

4. The camera of claim 1,
wherein a first cavity is formed between the first image sensor and the first lens part such that light passes therethrough, and
wherein a second cavity is formed between the second image sensor and the second lens part such that light passes therethrough.

5. The camera of claim 1,
wherein the first housing further accommodates a first driving part for driving the first lens part, and
wherein the second housing further accommodates a second driving part for driving the second lens part.

6. An electronic device comprising:
a camera comprising:
a substrate,
a first image sensor,
a second image sensor,
a first reinforcement member disposed in an area around a first area over the first image sensor and a second area over the second image sensor so as to support at least a portion of the substrate, a first housing disposed in an area including at least a portion of the first area so as to be stacked directly on one part of the first reinforcement member while accommodating a first lens part corresponding to the first image sensor, and
a second housing disposed in an area including at least a portion of the second area so as to be stacked directly on another part of the first reinforcement member while accommodating a second lens part corresponding to the second image sensor; and
a processor electrically connected to the camera,
wherein a first hole is formed at a position corresponding to the first area of the substrate,
wherein a second hole is formed at a position corresponding to the second area of the substrate,
wherein the first image sensor is disposed, at a position corresponding to the first hole, directly on a second reinforcement member which is disposed on an opposite side of the substrate from the first reinforcement member,
wherein the second image sensor is disposed, at a position corresponding to the second hole, directly on the second reinforcement member,
wherein the first reinforcement member comprises a first window and a second window through which the first image sensor and the second image sensor are exposed,
wherein a third window is formed between the first window and the second window, and
wherein an electronic component, associated with performance of at least one of the first image sensor or the second image sensor, is mounted through the third window.

7. The electronic device of claim 6, wherein the one part of the first reinforcement member and the other part of the first reinforcement member are integrally formed.

8. The electronic device of claim 6,
wherein the first housing further accommodates a first driving part for driving the first lens part,
wherein the second housing further accommodates a second driving part for driving the second lens part, and
wherein the first driving part accommodates a first type of lens and the second driving part accommodates a second type of lens.

9. The electronic device of claim 8,
wherein the first driving part comprises an actuator for a wide angle lens, and
wherein the second driving part comprises an actuator for a telephoto lens.

* * * * *